United States Patent
Xiao et al.

(10) Patent No.: US 11,239,262 B2
(45) Date of Patent: Feb. 1, 2022

(54) ARRAY SUBSTRATE COMBINING SENSING MATERIAL WITH THIN FILM TRANSISTOR, METHOD OF FABRICATING SAME, AND DISPLAY PANEL INCLUDING SAME

(71) Applicant: WUHAN CHINA STAR OPTOELECTRONICS TECHNOLOGY CO., LTD., Hubei (CN)

(72) Inventors: Juncheng Xiao, Hubei (CN); Chao Tian, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 16/630,916

(22) PCT Filed: Nov. 6, 2019

(86) PCT No.: PCT/CN2019/116099
§ 371 (c)(1),
(2) Date: Jan. 14, 2020

(87) PCT Pub. No.: WO2021/062917
PCT Pub. Date: Apr. 8, 2021

(65) Prior Publication Data
US 2021/0098510 A1 Apr. 1, 2021

(30) Foreign Application Priority Data
Sep. 30, 2019 (CN) .......................... 201910940029.0

(51) Int. Cl.
H01L 27/12 (2006.01)
H01L 27/142 (2014.01)
H01L 27/20 (2006.01)

(52) U.S. Cl.
CPC ........ H01L 27/1259 (2013.01); H01L 27/142 (2013.01); H01L 27/20 (2013.01); H01L 27/1225 (2013.01)

(58) Field of Classification Search
CPC ... H01L 27/1259; H01L 27/20; H01L 27/142; H01L 27/1225; H01L 29/78648; H01L 27/1214; H01L 27/3227
(Continued)

(56) References Cited

U.S. PATENT DOCUMENTS 9,721,968 B2 * 8/2017 Kozuma ............. H01L 27/1225
2013/0169351 A1 7/2013 Chang
(Continued)

FOREIGN PATENT DOCUMENTS

CN 103187302 A 7/2013
CN 103762251 A 4/2014
(Continued)

*Primary Examiner* — Duy T Nguyen

(57) ABSTRACT

An embodiment of the present invention discloses an array substrate, a method of fabricating the same, and a display panel. Compared with the conventional technology, the present invention combines a sensing material with thin film transistors to prepare a sensing layer on the thin film transistors, and since the thin film transistors can be formed by a large-area preparation, the sensors can be formed by a large-area preparation accordingly, thereby improving a performance of the sensors and reducing the production cost of the sensors.

5 Claims, 3 Drawing Sheets

(58) Field of Classification Search
USPC .......................................................... 257/43
See application file for complete search history.

(56) References Cited

U.S. PATENT DOCUMENTS

| | | | |
|---|---|---|---|
| 2013/0240886 A1* | 9/2013 | Yeh ..................... | H01L 27/1251 |
| | | | 257/57 |
| 2014/0217399 A1 | 8/2014 | Wu et al. | |
| 2017/0060313 A1 | 3/2017 | Kim et al. | |
| 2017/0221971 A1* | 8/2017 | Shen ..................... | G06F 3/0445 |
| 2017/0323930 A1* | 11/2017 | Zhao ................... | H01L 51/0545 |
| 2018/0174552 A1 | 6/2018 | Zhang et al. | |
| 2019/0204978 A1* | 7/2019 | Cheng ................... | H01L 41/042 |
| 2020/0012369 A1 | 1/2020 | Guo et al. | |
| 2021/0004100 A1* | 1/2021 | Zhang ................. | G06F 3/04166 |

FOREIGN PATENT DOCUMENTS

| | | |
|---|---|---|
| CN | 105573000 A | 5/2016 |
| CN | 107195665 A | 9/2017 |
| CN | 108735782 A | 11/2018 |
| TW | 201432889 A | 8/2014 |

\* cited by examiner ary SUBSTRATE COMBINING SENSING MATERIAL WITH THIN FILM TRANSISTOR, METHOD OF FABRICATING SAME, AND DISPLAY PANEL INCLUDING SAME

BACKGROUND OF INVENTION

Field of Invention

The present invention relates to a field of display technologies, and in particular, to an array substrate, a method of fabricating the same, and a display panel.

Description of Prior Art

Thin film transistor (TFT) is widely used in a field of display, which employs a glass as a substrate, and is fabricated by depositing a semiconductor layer and a metal layer on the glass by a film formation process, followed by a photolithography process. The TFTs can be fabricated by a large-area preparation based on the glass at a lower cost, and thus they become the core of current display technologies.

With a rapid development of current smart phones, functions such as fingerprint recognition are widely used in mobile security fields. Currently, main inductive sensors are fabricated based on silicon-based chips, which are costly and have a small sensor area, resulting in insufficient device functions and performance.

SUMMARY OF INVENTION

An embodiment of the present invention provides an array substrate, a method of fabricating the same, and a display panel. Compared with the conventional technology, the present invention combines a sensing material with thin film transistors to prepare a sensing layer on the thin film transistors, and since the thin film transistors can be formed by a large-area preparation, the sensors can be formed by a large-area preparation accordingly, thereby improving a performance of the sensors and reducing the production cost of the sensors.

In order to solve the above problems, in a first aspect, the present application provides an array substrate, the array substrate includes: a substrate; a first gate layer formed on the substrate; a pixel array layer formed on the first gate layer; and a second gate layer formed on the pixel array layer, wherein the second gate layer includes a first electrode layer, a sensing layer and a second electrode layer, the sensing layer is formed on the first electrode layer, and the second electrode layer is formed on the sensing layer.

Further, the pixel array layer includes:
a first gate insulating layer formed on the first gate layer;
an active layer formed on the first gate insulating layer;
a second gate insulating layer formed on the active layer, wherein the second gate insulating layer is provided with a first via hole;
a metal layer formed on the second gate insulating layer, wherein the metal layer is in contact with the active layer through the first via hole, and the metal layer is provided with a second via hole; and
an interlayer insulating layer formed on the metal layer, wherein the interlayer insulating layer is in contact with the second gate insulating layer through the second via hole, the interlayer insulating layer is provided with a third via hole, and the second gate layer is located in the third via hole.

Further, the active layer includes single crystalline silicon, polycrystalline silicon, or indium gallium zinc oxide.

Further, the sensing layer is a photovoltaic sensing layer, a pressure-sensitive sensing layer, or a semiconductor sensing layer.

In a second aspect, the present application provides a display panel. The display panel includes an array substrate, and the array substrate includes:
a substrate;
a first gate layer formed on the substrate;
a pixel array layer formed on the first gate layer; and
a second gate layer formed on the pixel array layer,
wherein the second gate layer includes a first electrode layer, a sensing layer and a second electrode layer, the sensing layer is formed on the first electrode layer, and the second electrode layer is formed on the sensing layer.

Further, the pixel array layer includes:
a first gate insulating layer formed on the first gate layer;
an active layer formed on the first gate insulating layer;
a second gate insulating layer formed on the active layer, wherein the second gate insulating layer is provided with a first via hole;
a metal layer formed on the second gate insulating layer, wherein the metal layer is in contact with the active layer through the first via hole, and the metal layer is provided with a second via hole; and
an interlayer insulating layer formed on the metal layer, wherein the interlayer insulating layer is in contact with the second gate insulating layer through the second via hole, the interlayer insulating layer is provided with a third via hole, and the second gate layer is located in the third via hole.

Further, the active layer includes single crystalline silicon, polycrystalline silicon, or indium gallium zinc oxide.

Further, the sensing layer is a photovoltaic sensing layer, a pressure-sensitive sensing layer, or a semiconductor sensing layer.

In a third aspect, the present application provides a method of fabricating an array substrate, the method including: forming a first gate insulating layer on the first gate layer; forming an active layer on the first gate insulating layer; forming a second gate insulating layer on the active layer, wherein the second gate insulating layer is formed with a first via hole; forming a metal layer on the second gate insulating layer, wherein the metal layer is in contact with the active layer through the first via hole, and the metal layer is formed with a second via hole; and forming an interlayer insulating layer on the metal layer, wherein the interlayer insulating layer is in contact with the second gate insulating layer through the second via hole, the interlayer insulating layer is formed with a third via hole, and the second gate layer is located in the third via hole.

Further, the step of forming a pixel array layer on the first gate layer includes:
forming a first gate insulating layer on the first gate layer;
forming an active layer on the first gate insulating layer;
forming a second gate insulating layer on the active layer;
forming a metal layer on the second gate insulating layer; and
forming an interlayer insulating layer on the metal layer.

Further, the step of forming a metal layer on the second gate insulating layer includes:
depositing a metal material on the second gate insulating layer; and
patterning the metal material to form a source/drain layer and the first electrode layer.

Further, the step of forming a second gate layer on the active layer includes:

forming a sensing layer on the first electrode; and forming a second electrode layer on the sensing layer to obtain the second gate layer.

Further, the step of forming the first gate layer on the substrate includes:

depositing a first gate material on the substrate; and patterning the first gate material to obtain the first gate layer.

Advantageous Effects

In an embodiment of the present invention, an array substrate is provided, the array substrate includes: a substrate; a first gate layer formed on the substrate; a pixel array layer formed on the first gate layer; and a second gate layer formed on the pixel array layer, wherein the second gate layer includes a first electrode layer, a sensing layer and a second electrode layer, the sensing layer is formed on the first electrode layer, and the second electrode layer is formed on the sensing layer. Compared with the conventional technology, the present invention combines a sensing material with thin film transistors to prepare a sensing layer on the thin film transistors, and since the thin film transistors can be formed by a large-area preparation, the sensors can be formed by a large-area preparation accordingly. The sensors are integrated into the display panel by the preparation of the sensing layer, such that the display panel possesses a performance of the sensors, thus improving a performance of the display panel, and reducing the production cost of the sensors.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
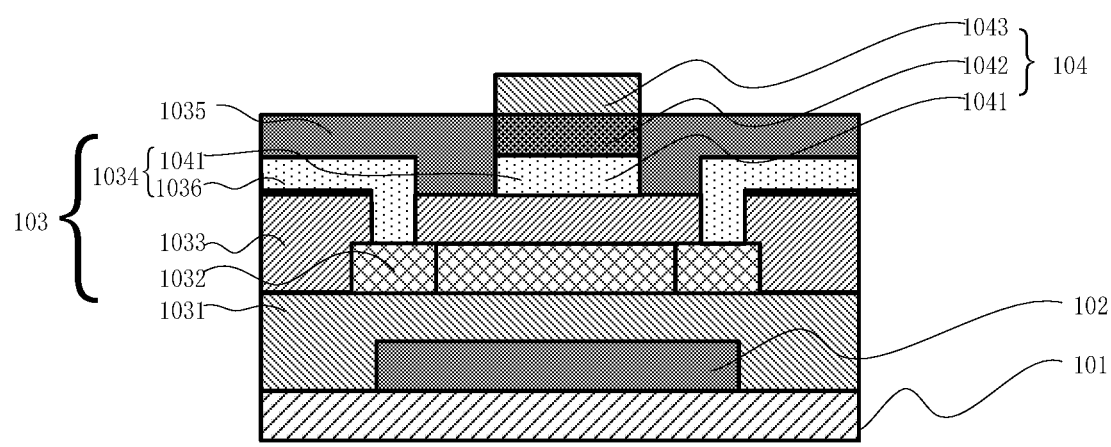
FIG. 1 is a schematic structural diagram of an array substrate according to an embodiment of the present invention.

Please refer to the figures in the drawings, in which, like numbers refer to like elements throughout the description of the figures. Hereinafter, the present invention will be described in further detail with reference to examples. It is to be understood, however, that these examples are for illustrative purposes only and are not intended to limit the scope of the present invention.

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present invention, the meaning of "a plurality" is two or more unless specifically defined otherwise.

With a rapid development of current smart phones, functions such as fingerprint recognition are widely used in mobile security fields. Currently, main inductive sensors are fabricated based on silicon-based chips, which are costly and have a small sensor area, resulting in insufficient device functions and performance.

To address this issue, an embodiment of the present invention provides an array substrate, a method of fabricating the same, and a display panel, which are respectively described in detail below.

First, an embodiment of the present invention provides an array substrate, the array substrate includes: a substrate; a first gate layer formed on the substrate; a pixel array layer formed on the first gate layer; and a second gate layer formed on the pixel array layer, wherein the second gate layer includes a first electrode layer, a sensing layer and a second electrode layer, the sensing layer is formed on the first electrode layer, and the second electrode layer is formed on the sensing layer.

FIG. 1 is a schematic structural diagram of an array substrate according to an embodiment of the present invention, wherein the array substrate includes:

a substrate 101, which may be made of a rigid material or a flexible material, wherein the rigid material may be an inorganic material such as glass, and the flexible material may be polyimide;

a first gate layer 102, formed on the substrate 101, specifically, being a bottom gate electrode layer, wherein the bottom gate electrode layer is made of a metal, and the bottom gate electrode layer is configured to adjust a threshold voltage of a transistor;

a pixel array layer 103, formed on the first gate layer 102, wherein the pixel array film layer includes a multi-layered structure, and the multi-layered structure includes sequentially, a first gate insulating layer, an active layer, a second gate insulating layer, a metal layer, and an interlayer insulating layer; and a second gate layer 104, formed on the pixel array layer 103, specifically, being a top gate electrode layer, which is composed of a sensing material and a metal electrode, wherein the sensing material can convert a detection signal into a an electrical signal, and the electrical signal generated by the sensing material is used to control turn-on of the transistor to realize detection and output of the detection signal.

The second gate layer 104 includes a first electrode layer 1041, a sensing layer 1042, and a second electrode layer

1043. The sensing layer 1042 is formed on the first electrode layer 1041, and the second electrode layer 1043 is formed on the sensing layer.

Specifically, the first electrode layer is a lower electrode layer, the second electrode layer is an upper electrode layer, the sensing layer is prepared by using a sensing material, and the sensing material may be a photoelectric material or a piezoelectric material, etc. For example, the sensing material is a photoelectric material. The sensing material is not particularly limited in the present application, and may vary depending on the actual situation.

Figure 2:
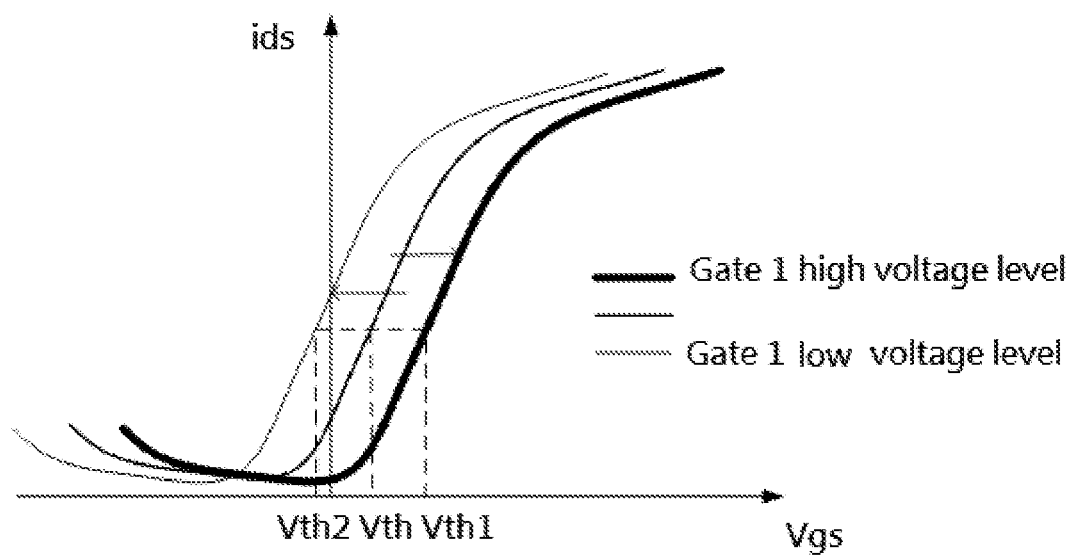
FIG. 2 is a schematic diagram of device characteristics according to an embodiment of the present invention.

As shown in FIG. 2, it is a schematic diagram of device characteristics according to an embodiment of the present invention. Based on the intrinsic characteristics of the thin film transistor, combined with the first gate layer and the second gate layer described in the present application, the detection signal is amplified and output by transistor amplification. Therefore, the transistor device has stronger detection capability and a higher on/off ratio. By controlling a voltage of the bottom gate electrode layer (Gate1), a threshold voltage (Vth) of the thin film transistor can be controlled. In actual device use, by using an appropriate bottom gate voltage, the thin film transistor can be controlled to operate within a subthreshold region or a linear region, etc., when the sensing material generates a charge to turn on the thin film transistor, so that the performance of the device can be optimized.

An embodiment of the present invention provides an array substrate, the array substrate includes: a substrate; a first gate layer formed on the substrate; a pixel array layer formed on the first gate layer; and a second gate layer formed on the pixel array layer, wherein the second gate layer includes a first electrode layer, a sensing layer and a second electrode layer, the sensing layer is formed on the first electrode layer, and the second electrode layer is formed on the sensing layer. Compared with the conventional technology, the present invention combines a sensing material with thin film transistors to prepare a sensing layer on the thin film transistors, and since the thin film transistors can be formed by a large-area preparation, the sensors can be formed by a large-area preparation accordingly, thereby improving a performance of the sensors and reducing the production cost of the sensors.

In another embodiment of the present application, the pixel array layer includes: a first gate insulating layer formed on the first gate layer; an active layer formed on the first gate insulating layer; a second gate insulating layer formed on the active layer, wherein the second gate insulating layer is provided with a first via hole; a metal layer formed on the second gate insulating layer, wherein the metal layer is in contact with the active layer through the first via hole, and the metal layer is provided with a second via hole; and an interlayer insulating layer formed on the metal layer, wherein the interlayer insulating layer is in contact with the second gate insulating layer through the second via hole, the interlayer insulating layer is provided with a third via hole, and the second gate layer is located in the third via hole.

As shown in FIG. 1, the pixel array layer includes:

a first gate insulating layer 1031 formed on the first gate layer 102, wherein, the first gate insulating layer has excellent electrical properties, and has a large dielectric constant and a strong ability for blocking Na+ diffusion, water vapor permeation, and diffusion of other impurity particles;

an active layer 1032 formed on the first gate insulating layer 1031;

a second gate insulating layer 1033 formed on the active layer 103, wherein the second gate insulating layer 1033 is provided with a first via hole;

a metal layer 1034 formed on the second gate insulating layer, and in contact with the active layer through the first via hole, wherein the metal layer is provided with a second via hole, and specifically, the metal layer 1034 includes a source/drain electrode layer 1036 and the first electrode layer 1041; and an interlayer insulating layer 1035 formed on the metal layer 1034, and in contact with the second gate insulating layer 1033 through the second via hole, wherein the interlayer insulating layer 1035 is formed with a third via hole, and the second gate layer 104 is located in the third via hole.

Bases on the above embodiments, in another embodiment of the present application, the active layer includes monocrystalline silicon, polycrystalline silicon or indium gallium zinc oxide. For example, the active layer includes polycrystalline silicon. The structure of the active layer is not particularly limited in the present application, and may vary depending on the actual situation.

Bases on the above embodiments, in another specific embodiment of the present application, the sensing layer is a photovoltaic sensing layer, a pressure sensitive sensing layer, or a semiconductor sensing layer.

Specifically, the sensing layer converts the detection signal into an electrical signal, to realize the sensing function. A material of the sensing layer is not particularly limited in the present application, and may vary depending on the actual situation.

In order to better implement the array substrate in an embodiment of the present invention, a display panel is further provided by an embodiment of the present invention, and the display panel includes the array substrate as described in the above embodiments.

By introducing the array substrate as described in the above embodiments, the array substrate includes: a substrate; a first gate layer formed on the substrate; a pixel array layer formed on the first gate layer; and a second gate layer formed on the pixel array layer, wherein the second gate layer includes a first electrode layer, a sensing layer and a second electrode layer, the sensing layer is formed on the first electrode layer, and the second electrode layer is formed on the sensing layer. Compared with the conventional technology, the present invention combines a sensing material with thin film transistors to prepare a sensing layer on the thin film transistors, and since the thin film transistors can be formed by a large-area preparation, the sensors can be formed by a large-area preparation accordingly, thereby improving a performance of the sensors, reducing the production cost of the sensors, and optimizing the sensing performance of the display panel.

In order to better implement the array substrate in an embodiment of the present invention, a method of fabricating an array substrate is further provided by an embodiment of the present invention, the method including: providing a substrate; forming a first gate layer on the substrate; forming a pixel array layer on the first gate layer; and forming a second gate layer on the pixel array layer, wherein the second gate layer includes a first electrode layer, a sensing layer and a second electrode layer, the sensing layer is formed on the first electrode layer, and the second electrode layer is formed on the sensing layer.

Figure 3:
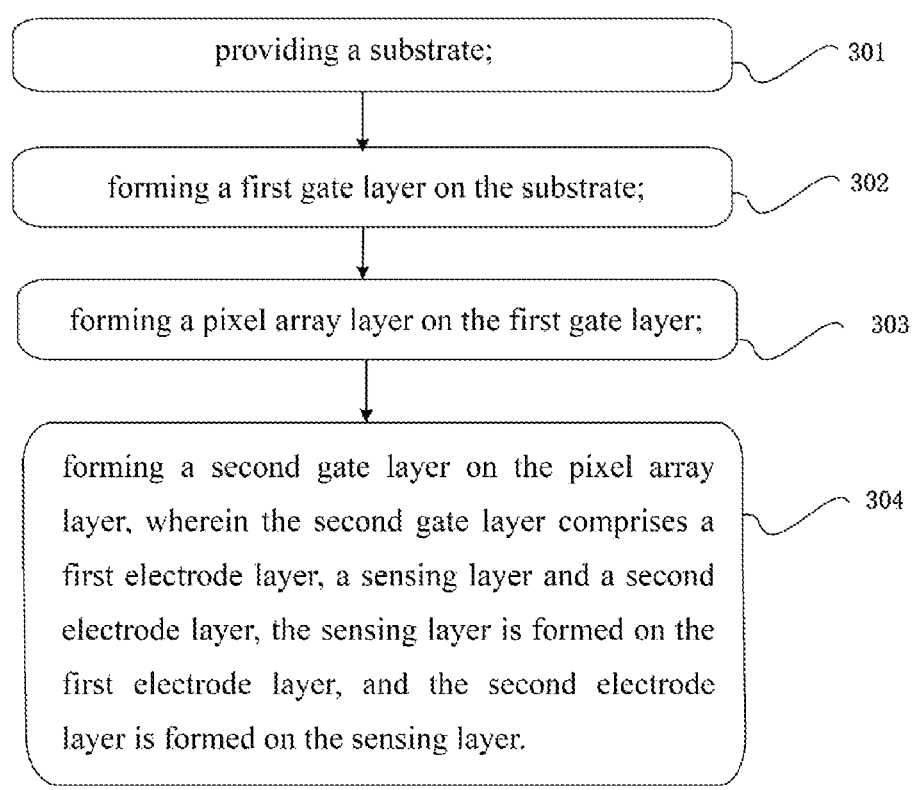
FIG. 3 is a schematic flow chart of a method of fabricating an array substrate according to an embodiment of the present invention.

As shown in FIG. 3, it is a schematic flowchart diagram of a method of fabricating an array substrate according to an embodiment of the present invention, and the method includes:

301. providing a substrate, specifically, being a glass substrate;

302. forming a first gate layer on the substrate, wherein the first gate layer is made of a metal material, and the first gate layer can be prepared by physical vapor deposition, exposure, and development; the physical vapor deposition generally uses sputtering, which is a thin film deposition method, that usually under a certain high vacuum state (a pressure of 50 Pa), employs an excitation source to allow charged particles in high vacuum to obtain high energy and to bombard a surface of a target, so that components (atoms or molecules) on the surface of the target get enough energy to splash on a surface of another medium (usually a glass substrate), and wherein the excited particles are usually an inert gas having a sufficient atomic mass to lose electrons and being positively charged under an action of the excitation source; in general, an kinetic energy of the excited ions of the atoms on the surface of the metal target needs to be 10 to 25 eV for sputtering, and this energy value is also known as the sputtering threshold energy; and a sputtering gas is generally selected from an inert gas, which has a stable performance and does not chemically react with atoms of the target;

303. forming a pixel array layer on the first gate layer, wherein specifically, the pixel array layer includes a plurality of layers, and the plurality of layers are sequentially deposited, exposed and developed for patterning; and 304. forming a second gate layer on the pixel array layer, wherein the second gate layer includes a first electrode layer, a sensing layer and a second electrode layer, the sensing layer is formed on the first electrode layer, and the second electrode layer is formed on the sensing layer.

Specifically, the second gate layer includes a three-layer structure, which is a first electrode layer, a sensing layer, and a second electrode layer, wherein the first electrode layer is prepared in the same layer with the source/drain layer in the pixel array layer, and after the preparation of the first electrode layer is completed, the sensing layer and the second electrode layer are sequentially prepared on the first electrode layer.

In the embodiments of the present invention, a method of fabricating an array substrate is provided, which is different from the prior art. The present application provides an array substrate, the array substrate includes: a substrate; a first gate layer formed on the substrate; a pixel array layer formed on the first gate layer; and a second gate layer formed on the pixel array layer, wherein the second gate layer includes a first electrode layer, a sensing layer and a second electrode layer, the sensing layer is formed on the first electrode layer, and the second electrode layer is formed on the sensing layer. The present invention combines a sensing material with thin film transistors to prepare a sensing layer on the thin film transistors, and since the thin film transistors can be formed by a large-area preparation, the sensors can be formed by a large-area preparation accordingly, thereby improving a performance of the sensors and reducing the production cost of the sensors.

Figure 4:
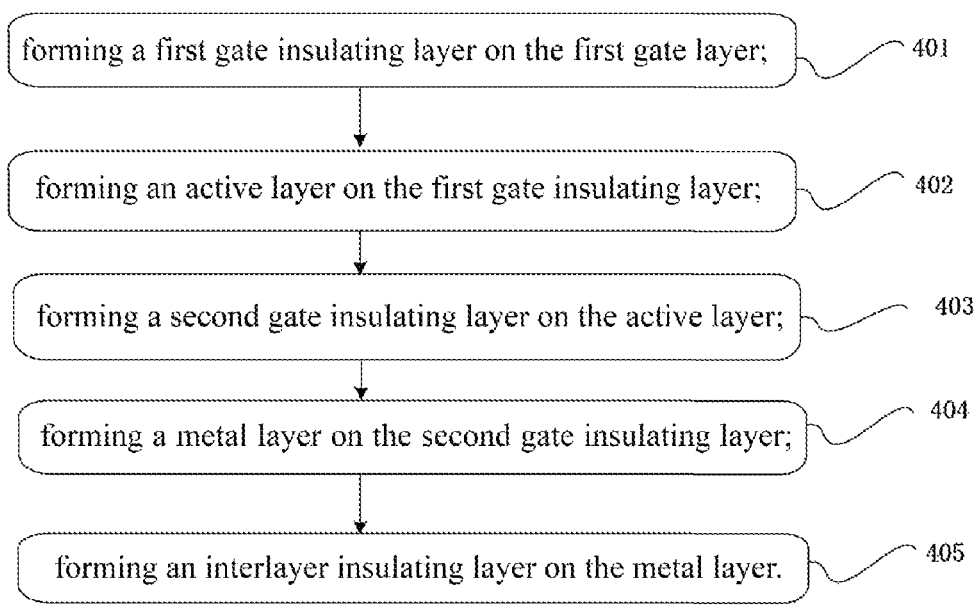
FIG. 4 is a schematic flow chart of a method of fabricating an array substrate according to another embodiment of the present invention.

Based on the foregoing embodiments, in another embodiment of the present application, as shown in FIG. 4, which is a flow chart of a method of fabricating an array substrate according to another embodiment of the present invention, a method of fabricating an array substrate is provided, and the step of forming a pixel array layer on the first gate layer includes:

401. forming a first gate insulating layer on the first gate layer;

402. forming an active layer on the first gate insulating layer;

403. forming a second gate insulating layer on the active layer;

404. forming a metal layer on the second gate insulating layer; and 405. forming an interlayer insulating layer on the metal layer.

Based on the above embodiment, in a specific embodiment of the present application, the step of forming a metal layer on the second gate insulating layer includes:

depositing a metal material on the second gate insulating layer; and patterning the metal material to form a source/drain layer and the first electrode layer.

Specifically, the metal layer includes a source/drain layer and a first electrode layer. A metal material is patterned by exposure and development to form a metal layer divided into two parts of the same height, wherein the two parts serve as the source/drain layer and the first electrode layer having different effects, respectively.

Based on the foregoing embodiment, in a specific embodiment of the present application, the step of forming a second gate layer on the active layer includes:

forming a sensing layer on the first electrode; and forming a second electrode layer on the sensing layer to obtain the second gate layer.

Based on the above embodiments, in a specific embodiment of the present application, the step of forming the first gate layer on the substrate includes:

depositing a first gate material on the substrate; and patterning the first gate material to obtain the first gate layer.

In the above-mentioned embodiments, the description of each embodiment has its own emphasis, a part that is not detailed in a certain embodiment can be referred to the detailed description in other embodiments above, and details are not repeated herein for brevity.

In a specific implementation, the foregoing various units or structures may be implemented as an independent entity, or may be implemented in any combination, as a same entity or several entities. The specific implementation of the above various units or structures can be referred to the foregoing method embodiments, and details are not repeated herein for brevity The specific implementation of the foregoing operations can be referred to the foregoing embodiments, and details are not repeated herein for brevity.

The array substrate, the method of fabricating the same and the display panel provided by the embodiments of the present invention are described in detail. The principles and embodiments of the present invention are described herein with reference to specific examples. The description of the above embodiments is only for the purpose of understanding the method of the present invention and the core idea thereof. Meanwhile, those skilled in the art will be able to change the specific embodiments and the scope of application according to the idea of the present invention. In summary, the content of the present specification should not be construed as limiting the present invention.

What is claimed is:

1. An array substrate, wherein the array substrate comprises:

a substrate;

a first gate layer formed on the substrate;

a pixel array layer formed on the first gate layer; and a second gate layer formed on the pixel array layer, wherein the second gate layer comprises a first electrode layer, a sensing layer and a second electrode layer, the pixel array layer comprises a first gate insulating layer disposed on the first gate layer, an active layer disposed on the first gate insulating layer, a second gate insulating layer disposed on the active layer, and a source/drain layer disposed on the second gate insulating layer, an upper surface of the first electrode layer is level with an upper surface of the source/drain layer of the pixel array layer, the sensing layer is formed on the first electrode layer, and the second electrode layer is formed on the sensing layer.

2. The array substrate according to claim 1, wherein the source/drain layer and the first electrode layer are formed of a metal layer, the second gate insulating layer is provided with a first via hole, the metal layer is in contact with the active layer through the first via hole, and the metal layer is provided with a second via hole; and an interlayer insulating layer formed on the metal layer, wherein the interlayer insulating layer is in contact with the second gate insulating layer through the second via hole, the interlayer insulating layer is provided with a third via hole, and the second gate layer is located in the third via hole.

3. The array substrate according to claim 2, wherein the active layer comprises single crystalline silicon, polycrystalline silicon, or indium gallium zinc oxide.

4. The array substrate according to claim 1, wherein the sensing layer is a photovoltaic sensing layer, a pressure-sensitive sensing layer, or a semiconductor sensing layer.

5. A display panel, wherein the display panel comprises an array substrate, and the array substrate comprises:

a substrate;

a first gate layer formed on the substrate;

a pixel array layer formed on the first gate layer; and a second gate layer formed on the pixel array layer, wherein the second gate layer comprises a first electrode layer, a sensing layer and a second electrode layer, the pixel array layer comprises a first gate insulating layer disposed on the first gate layer, an active layer disposed on the first gate insulating layer, a second gate insulating layer disposed on the active layer, and a source/drain layer disposed on the second gate insulating layer, an upper surface of the first electrode layer is level with an upper surface of the source/drain layer of the pixel array layer, the sensing layer is formed on the first electrode layer, and the second electrode layer is formed on the sensing layer.

* * * * *